(12) United States Patent
Dinger et al.

(10) Patent No.: US 8,934,085 B2
(45) Date of Patent: Jan. 13, 2015

(54) BUNDLE-GUIDING OPTICAL COLLECTOR FOR COLLECTING THE EMISSION OF A RADIATION SOURCE

(75) Inventors: Udo Dinger, Oberkochen (DE); Christopher Weth, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 881 days.

(21) Appl. No.: 12/726,081

(22) Filed: Mar. 17, 2010

(65) Prior Publication Data

US 2010/0231882 A1 Sep. 16, 2010

Related U.S. Application Data

(63) Continuation of application No. PCT/EP2008/007756, filed on Sep. 17, 2008.

(60) Provisional application No. 60/974,120, filed on Sep. 21, 2007.

(30) Foreign Application Priority Data

Sep. 21, 2007 (DE) .......................... 10 2007 045 396

(51) Int. Cl.
G03B 27/54 (2006.01)
G03F 7/20 (2006.01)
G02B 5/08 (2006.01)
G02B 5/09 (2006.01)

(52) U.S. Cl.
CPC .......... *G03F 7/70175* (2013.01); *G02B 5/0891* (2013.01); *G02B 5/09* (2013.01); *G03F 7/70083* (2013.01); *G21K 2201/064* (2013.01)
USPC ........................................................ 355/67

(58) Field of Classification Search
CPC ... G03F 7/70075; G02B 26/12; G02B 17/002
See application file for complete search history.

(56) References Cited

U.S. PATENT DOCUMENTS 5,339,346 A 8/1994 White
6,198,793 B1 * 3/2001 Schultz et al. .................. 378/34
(Continued)

FOREIGN PATENT DOCUMENTS

DE 102 12 405 10/2002
DE 103 59 576 7/2005
(Continued)

OTHER PUBLICATIONS

Sergey Kochengin et al., Inverse Problems 13 (1997), p. 363 to 373.
(Continued)

*Primary Examiner* — Peter B Kim
*Assistant Examiner* — Michelle Iacoletti
(74) *Attorney, Agent, or Firm* — Fish & Richardson P.C.

(57) ABSTRACT

A bundle-guiding optical collector collects an emission of a radiation source and forms a radiation bundle from the collected emission. A reflective surface of the collector is the first bundle-forming surface downstream of the radiation source. The reflective surface is formed such that it converts the radiation source into a family of images in a downstream plane. The family of images includes a plurality of radiation source images which are offset to each other in two dimensions (x, y) in a direction perpendicular to the beam direction of the transformed radiation bundle and are arranged relative to each other in a non-rotationally symmetric manner relative to the beam direction of the transformed radiation bundle. The transformed radiation bundle in the downstream plane has a non-rotationally symmetric bundle edge contour relative to the beam direction of the transformed radiation bundle. The result is a collector in which the radiation bundle shape generated by the collector. In other words, the illumination distribution generated by the collector in a defined manner in the plane downstream of the collector has a shape which is freely selectable to the greatest possible extent.

22 Claims, 14 Drawing Sheets

(56) References Cited

U.S. PATENT DOCUMENTS

| | | |
|---|---|---|
| 6,229,595 B1 | 5/2001 | McKinley et al. |
| 6,353,470 B1 | 3/2002 | Dinger |
| 6,438,199 B1 | 8/2002 | Schultz et al. |
| 6,507,440 B1 | 1/2003 | Schultz |
| 6,522,387 B2 * | 2/2003 | Mulkens .................. 355/52 |
| 6,660,552 B2 | 12/2003 | Payne et al. |
| 6,710,917 B2 | 3/2004 | Mann et al. |
| 6,902,283 B2 | 6/2005 | Dinger |
| 6,922,291 B2 | 7/2005 | Sunaga et al. |
| 6,929,373 B2 | 8/2005 | Yoshikawa et al. |
| 6,947,210 B2 | 9/2005 | Terasawa |
| 7,070,289 B2 | 7/2006 | Sasaki et al. |
| 7,114,818 B2 | 10/2006 | Minakata |
| 7,186,983 B2 | 3/2007 | Mann et al. |
| 7,400,699 B2 | 7/2008 | Singer et al. |
| 7,538,948 B2 * | 5/2009 | Muenz et al. ............ 359/618 |
| 7,682,031 B2 | 3/2010 | Mann et al. |
| 2003/0002022 A1 | 1/2003 | Schultz |
| 2003/0063375 A1 | 4/2003 | Suzuki et al. |
| 2003/0147130 A1 | 8/2003 | Terasawa |
| 2003/0197914 A1 | 10/2003 | Cox et al. |
| 2004/0090609 A1 | 5/2004 | Komatsuda |
| 2004/0189968 A1 | 9/2004 | Terasawa |
| 2005/0207039 A1 | 9/2005 | Singer et al. |
| 2006/0132747 A1 | 6/2006 | Singer et al. |
| 2006/0208206 A1 * | 9/2006 | Hainz et al. ............ 250/493.1 |
| 2007/0058269 A1 | 3/2007 | Mann et al. |
| 2009/0051890 A1 | 2/2009 | Mann et al. |

FOREIGN PATENT DOCUMENTS

| | | |
|---|---|---|
| EP | 0 744 665 | 11/1996 |
| EP | 1 333 260 A2 | 8/2003 |
| EP | 1 335 228 A1 | 8/2003 |
| EP | 1 434 093 | 6/2004 |
| JP | H10-51020 | 2/1998 |
| JP | 2000-098228 | 4/2000 |
| JP | 2000-098230 | 4/2000 |
| JP | 2001-185480 | 7/2001 |
| JP | 2002-015979 | 1/2002 |
| JP | 2002-139672 | 5/2002 |
| JP | 2002-319536 | 10/2002 |
| JP | 2003-045782 | 2/2003 |
| JP | 2003-203860 | 7/2003 |
| JP | 2003-222572 | 8/2003 |
| JP | 2003-233002 | 8/2003 |
| JP | 2004-029625 | 1/2004 |
| JP | 2004-512552 | 4/2004 |
| JP | 2004-516500 | 6/2004 |
| JP | 2004-214242 | 7/2004 |
| JP | 2004-525398 | 8/2004 |
| JP | 2005-055553 | 3/2005 |
| JP | 2005-172988 | 6/2005 |
| JP | 2006-523944 | 10/2006 |
| JP | 2007-234717 | 9/2007 |
| TW | 594043 | 6/2004 |
| TW | 200632372 A | 9/2006 |
| WO | WO 02/48796 | 6/2002 |
| WO | WO 02/056114 | 7/2002 |
| WO | WO 2004/092844 | 10/2004 |
| WO | WO 2006/050891 | 5/2006 |
| WO | WO 2006/069725 | 7/2006 |
| WO | WO 2007/045434 | 4/2007 |

OTHER PUBLICATIONS

English translation of Japanese office action for corresponding JP Application No. 2009-503 430, dated Feb. 27, 2012.

English translation of Office Action for corresponding Application No. JP 2008-529565, dated Feb. 21, 2011.

Office Action for JP Application No. JP 2008-529565, dated Dec. 7, 2009.

Japanese Office Action, with translation thereof, for corresponding JP Appl No. 2010-525245, dated May 29, 2013.

Japanese office action, with English translation thereof, for corresponding JP Appl No. 2008-006616, dated May 27, 2013.

B. Tatian, "Nonrotationally Symmetric Systems: A New Problem for Optical Design and Fabrication, Applications of Geometrical Optics", Proc. SPIE, 39:205, (1973).

B. Tatian, "Testing an Unusual Optical Surface", International Lens Design Conference, Proc. SPIE, 554:139, (1985).

Taiwanese office action, with English translation thereof, for corresponding TW Appl No. 97 101 634, dated Sep. 10, 2013.

Japanese office action, with English translation thereof, for JP Appl No. 2010-525 245, dated Mar. 11, 2014.

* cited by examiner

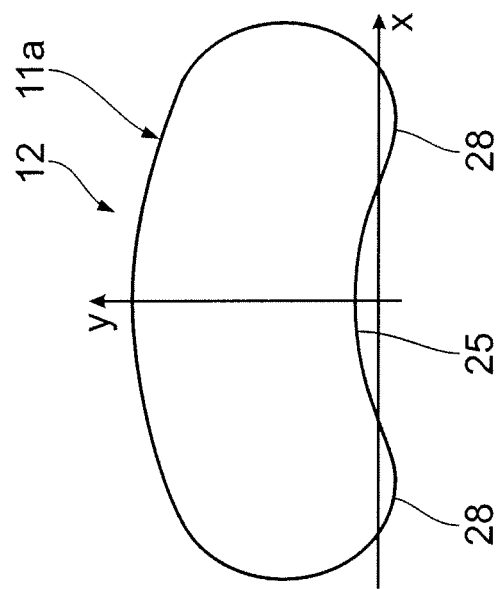
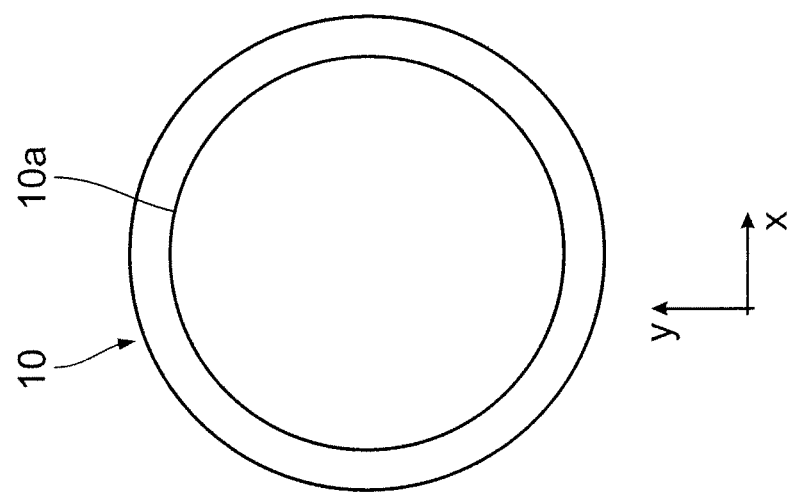
Fig. 2
Fig. 1a

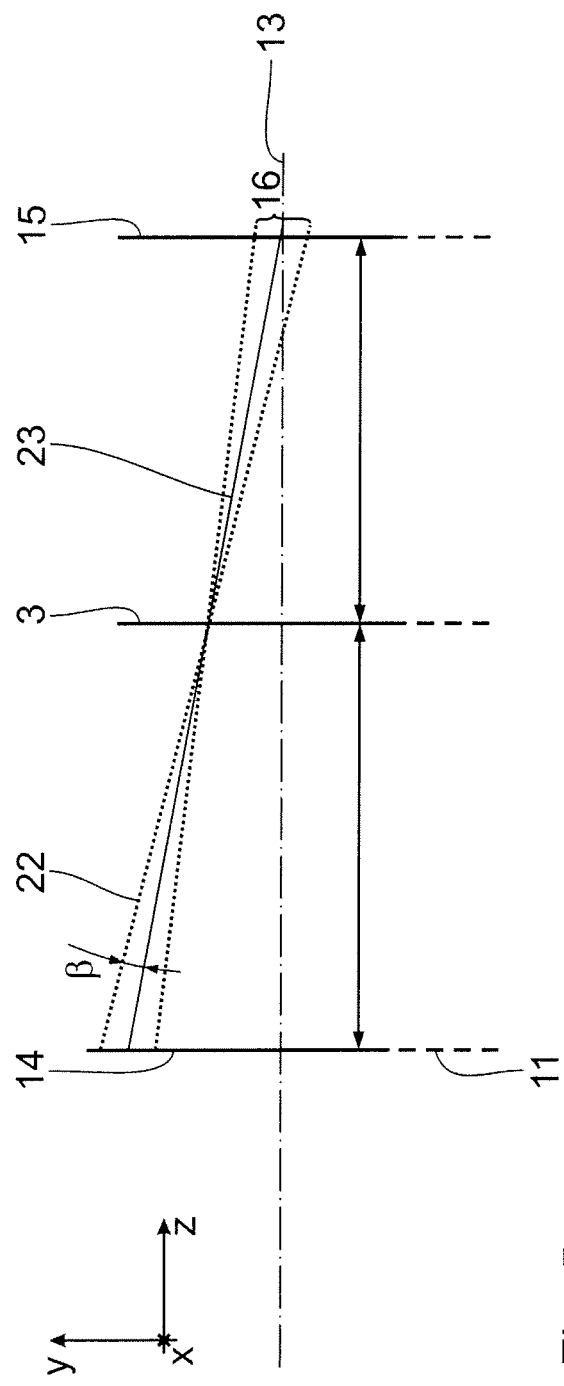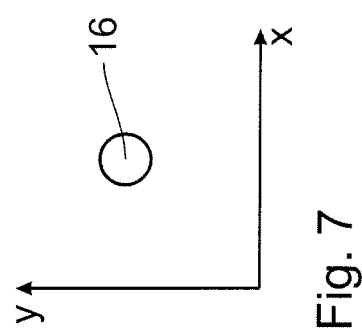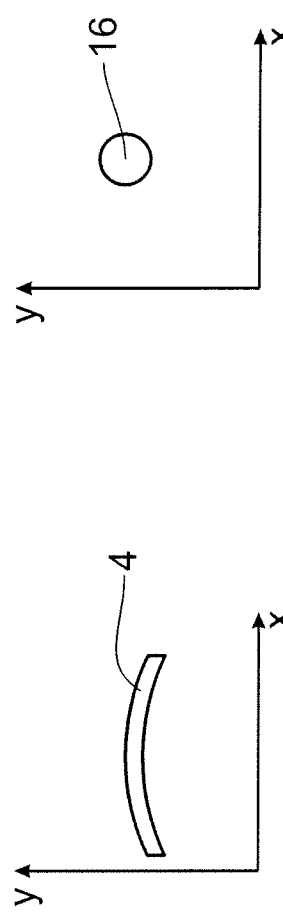

BUNDLE-GUIDING OPTICAL COLLECTOR FOR COLLECTING THE EMISSION OF A RADIATION SOURCE

CROSS-REFERENCE TO RELATED APPLICATIONS

This application is a continuation of, and claims benefit under 35 USC 120 to, international application PCT/EP2008/007756, filed Sep. 17, 2008, which claims benefit of German Application No. 10 2007 045 396.7, filed Sep. 21, 2007 and U.S. Ser. No. 60/974,120, filed Sep. 17, 2007. International application PCT/EP2008/007756 is hereby incorporated by reference in its entirety.

FIELD

The disclosure relates to a bundle-guiding optical collector that collects an emission of a radiation source and forms a transformed radiation bundle from a collected source-side radiation bundle. The disclosure also relates to an EUV illumination system, an EUV projection exposure apparatus, a production method for a microstructured component, and a microstructured component produced according to a method of this type.

BACKGROUND

WO 2007/045 434 A2, U.S. Pat. No. 6,438,199, U.S. Pat. No. 6,507,440 and U.S. Pat. No. 5,339,346 disclose examples of collectors that can collect the emission of EUV (extreme ultraviolet) radiation sources that emit radiation, for example, in the wavelength range of between 10 nm and 30 nm.

EUV radiation sources generally have radiation patterns that are rotationally symmetric or axially symmetric relative to a radiation axis. The assigned collectors are generally designed such that the EUV radiation is collected in an axially symmetric solid angle that is as large as possible.

Depending on the desired properties of an illumination system, including a collector of this type with respect to the defined illumination of an illumination field, it may be desirable for a radiation bundle to be formed downstream of the collector. The desired shape of the radiation bundle generally deviates from a rotationally symmetric bundle shape.

SUMMARY

The disclosure provides a collector such that the shape of the radiation bundle shape, in other words the illumination distribution generated by the collector in the plane downstream of the collector, is freely selectable to the greatest possible extent.

It has been found according to the disclosure that the idea of converting the radiation source into a plurality of radiation source images which are two-dimensionally offset relative to each other, such as disclosed herein, can offer the possibility of providing virtually any shape of illumination distributions in a plane downstream of the collector, the plane also being referred to as bundle forming plane. The collector according to the disclosure is therefore in particular suitable for illumination systems in which an illumination distribution deviating from the rotational symmetry in a defined manner is involved in a downstream illumination field. This illumination distribution need not be generated by shadowing of illumination light, with the result that the rate of useful emission of the radiation source increases. The precise shape of the reflective surface of the collector can be defined by a corresponding algorithm for modifying the imaging into the radiation source images or the forming of the bundle edge contour, in other words, the edge of the optically used region of the reflective surface of the bundle-guiding optical collector. A mathematical algorithm of this type is known from Kochengin and Oliker, Inverse Problems 13 (1997), p. 363 to 367. The emission of the radiation source can be collected by the optical collector either directly or by an intermediate image of the radiation source.

Embodiments can in particular applicable for illumination of a specular reflector which is described in US 2006/0132747 A1. The bundle edge contour of the transformed radiation bundle, and therefore the illumination distribution on the specular reflector, is adapted to the shape of the illumination field which generally deviates from the rotational symmetry. In particular if it is desired to illuminate an illumination field with a high aspect ratio, for instance a rectangular or an arcuate annular field, the illumination distribution involved on the specular reflector greatly deviates from the rotational symmetry. In such an embodiment, the flexibility of the reflector according to the disclosure is particularly effective when producing illumination distributions of virtually any shape. The bundle edge contour in the downstream plane and thus the illumination distribution can be generated by back projection from the shapes of a pupil illumination distribution of a downstream imaging optics on the one hand and from the shape of an illumination or object field on the other hand, which is to be illuminated using the transformed radiation bundle and is disposed upstream of the imaging optics. The back projection then takes place from the direction of the illuminated pupil plane of the imaging optics through the object field and on the downstream plane. In the case of an arcuate illumination field for example, the illumination distribution in the downstream plane may have the shape of a kidney or of a bean.

Embodiments can be particularly advantageous if an illumination of the field facet mirror is involved that deviates from the rotational symmetry to a greater extent. U.S. Pat. No. 7,186,983 B2 provides an example of such an illumination of a field facet mirror.

A facet division can enable the illumination distribution to be formed by defining the relative positions of the radiation source images relative to each other, the radiation source images being provided by the individual facets in the bundle forming plane.

An arrangement of the facets in the shape of a parquet or a tiling pattern can advantageously use virtually the entire reflective surface so that virtually no useful radiation gets lost when reflected at the collector. This enables a gap-free and non-overlapping coverage of the reflective surface to be achieved. Such tiling patterns are known from mathematical theory. Homogeneous tiling patterns, regular tiling patterns but also inhomogeneous tiling patterns are conceivable.

Different facet areas can enable the intensity distribution to be adapted within the illumination distribution to be set in the bundle forming plane. This can also be used to compensate for an inhomogeneous emission of the radiation source or to precompensate for downstream inhomogeneities.

Facets can maximum coverage rate of the entire collector surface with the individual facets. In particular, types of coverage may be chosen which enable a slight variation of incidence angles on the collector to be achieved.

An arrangement can ensure a clear assignment of the facets to regions of the illumination distribution in the bundle forming plane.

Reflector surfaces can enable a defined imaging of the radiation source to be achieved.

A smoothing operation can avoid discrete intensity peaks in an illumination field which is to be illuminated by the radiation guidance via the collector. Smoothing can for example be performed by parameterization of the reflective surface via a continuous set of functions, for instance via Zernike functions. Smoothing may also be performed via Spline functions.

A shaping of the reflective surface can enable the division of the radiation source image to be adapted to the respective desired illumination properties. Examples of such a conic section include a circle, an ellipse, a hyperbola and a parabola. The section which is not parameterizable by way of a conic section may be a freeform section which is not describable by way of a closed analytic function but by way of a series expansion, for example.

A reflective surface designed as a freeform surface can offer a sufficient amount of degrees of freedom for the arrangement of the radiation source images, which is adapted to the desired properties of the illumination. The freeform surface can be parameterized in the manner as disclosed for example in US 2007-0058269 A1 with respect to the shaping of mirrors in projection objectives for microlithographic projection exposure apparatuses. Likewise, Spline functions or Zernike functions can be used for parameterization of such a freeform surface as well.

A reflective surface which is actively changeable in shape can enable dynamically different illuminations to be provided in the bundle forming area, depending on the desired properties on the illumination side. Via the shaping of the collector, it is thus possible to provide illumination distributions which may then serve to define different illumination settings in the downstream optical components of an illumination system.

An adaptation of tilting angles can improve the optical properties of the illumination. This enables in particular imaging errors of downstream optics in an illumination system including the collector to be compensated for to at least some extent.

The advantages of an illumination system and a projection exposure apparatus correspond to those already described above in relation to the collector.

A projection exposure apparatus can, in particular, be suitable for defining an illumination setting with a single bundle-guiding optical element between the collector and the object. This guarantees an illumination with as few losses as possible.

The advantages of a production method and of a microstructured component correspond to those already described above.

BRIEF DESCRIPTION OF THE DRAWINGS

Embodiments of the disclosure will hereinafter be described in more detail by the drawings in which:

FIG. 1a shows a reduced view (compared to FIG. 1) of a collector of the EUV illumination system from direction Ia;

FIG. 2 shows the shape of an illumination distribution of an EUV radiation bundle in a plane II-II in FIG. 1;

FIG. 5 shows a schematic view similar to FIG. 1 of the guidance of the EUV radiation bundle between the plane shown in FIG. 2 and an entrance pupil plane of a projection objective of the EUV projection exposure apparatus;

FIG. 6 shows the illumination of an object field or illumination field, respectively, in an object plane of the EUV projection exposure apparatus;

FIG. 7 shows the illumination of an entrance pupil of the projection objective;

DETAILED DESCRIPTION

Figure 1:
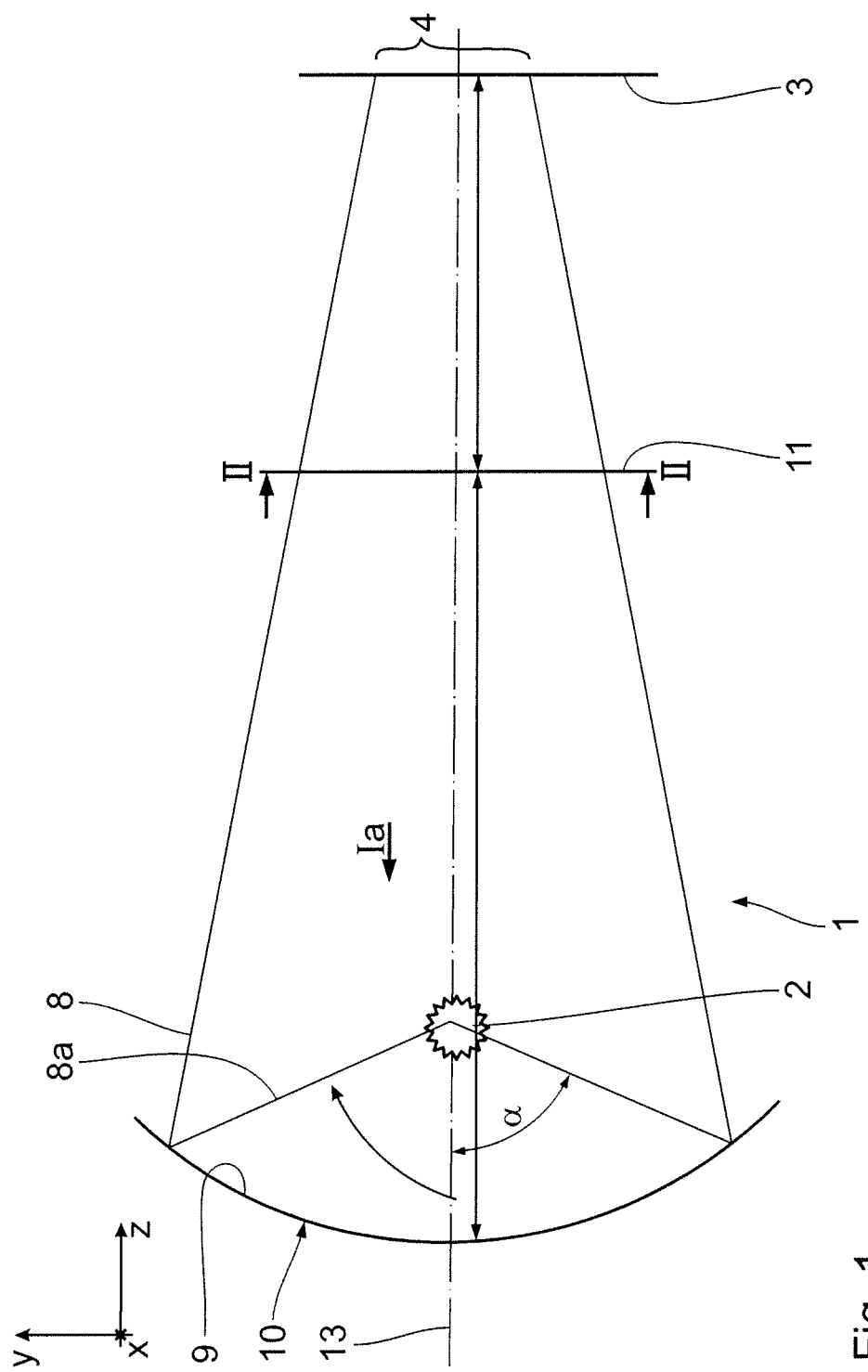
FIG. 1 shows a schematic meridional sectional view of an EUV illumination system of an EUV projection exposure apparatus.

An EUV illumination system 1 is shown in FIG. 1 in a schematic view between an EUV radiation source 2 and an illumination field plane, or object plane, 3. The EUV illumination system 1 serves for defined illumination of an arcuate illumination field 4 according to FIG. 6 in the illumination field plane 3. The illumination field 4 illuminates a reflective reticle 5 (cf. FIG. 3). The illumination field 4 is imaged into an image field in an image plane 6 via a projection objective not shown in detail in which a wafer is disposed which is provided with an EUV-radiation-sensitive coating. A Cartesian x-y-z coordinate system will be used in the following description in order to facilitate the description of relative positions. In FIG. 1, the x-axis extends perpendicularly into the drawing plane. The y-axis extends upwardly. The z-axis extends to the right-hand side. The EUV illumination system 1 and the EUV projection objective are components of an EUV projection exposure apparatus 7, which is shown as a whole in the schematic view of FIG. 3, for the production of microstructured or nanostructured integrated semiconductor components. The EUV projection exposure apparatus 7 is designed in the manner of a scanner. The scan direction is parallel to the short sides of the arcuate illumination field, thus extending in the y-direction in FIG. 1.

The EUV radiation source emits EUV emission approximately uniformly in all directions. An EUV emission 8a with a half-angle of aperture α of 44.4°, in other words a source-side radiation bundle, is collected by a surface 9 of an EUV collector 10, which is reflective of EUV radiation, and is formed into a transformed radiation bundle 8. The collected numerical aperture at the radiation source 2 thus amounts to NA=0.7, with the reflective surface 9 being the first bundle-forming surface downstream of the EUV radiation source 2. The reflective surface 9 is thus the first bundle-guiding surface which influences the shape of the EUV radiation bundle 8. A plane mirror surface is an example of a bundle-guiding surface which, unlike the reflective surface 9, has no influence on the shape.

The distance of the radiation source 2 from the collector 10 amounts to 400 mm.

FIG. 1a shows an edge contour 10a of the surface on the EUV collector 10 which is provided for exposure to the source-side radiation bundle 8a. The edge contour 10a has a circular shape which, in other words, is mirror-symmetric with respect to two perpendicular axes spanning the edge contour 10a. These two axes are in particular the x- and the y-axis.

The reflective surface 9 is formed such as to convert the EUV radiation source 2 into a plurality of adjacent radiation source images which are arranged relative to each other in a defined manner in a downstream bundle forming plane 11, as will be explained in more detail below.

When seen in a sectional view, the EUV radiation bundle 8 has an approximately kidney- or bean-shaped edge contour 11a in the bundle forming plane 11, with the result that the illumination distribution 12 shown in FIG. 2 is obtained.

FIG. 1 shows a stretched view of the EUV illumination system along an optical axis 13, wherein for purposes of simplifying the illustration, neither the folded design of the illumination system 1 nor the reflective effect of optical components downstream of the collector 10 are shown. The optical axis 13 extends along the z-axis of FIG. 1. The optical axis 13 in turn coincides with a main beam direction of the transformed EUV radiation bundle 8.

The bundle edge contour 11a is formed such that it is mirror-symmetric relative to a maximum of one axis, namely the y-axis of FIG. 2 which, in the vicinity of the bundle forming plane 11, is perpendicular to a main beam direction of the radiation bundle 8, the main beam direction coinciding with the optical axis 13.

Figure 3:
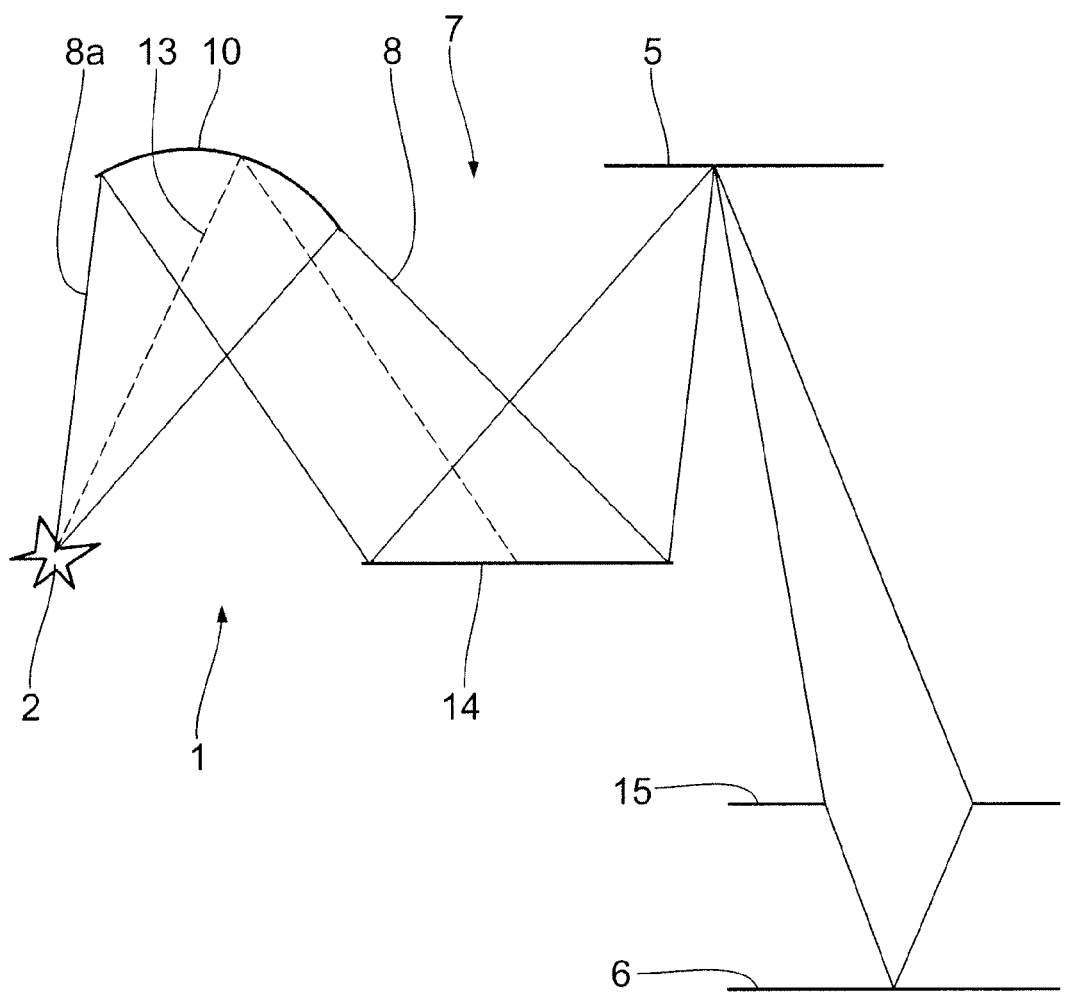
FIG. 3 shows a schematic view, illustrating reflective components, of an EUV projection exposure apparatus including an EUV illumination system.

FIG. 3 shows the EUV projection exposure apparatus 7 in the vicinity of the EUV illumination system 1, including the folding effect of the reflective elements illustrated in FIG. 3. At the location of the bundle forming plane 11 is arranged a specular reflector 14 which forms the incident EUV radiation bundle 8 hitting the specular reflector with the illumination distribution 12 such that the EUV radiation bundle 8 illuminates the illumination field 4 in the illumination field plane 3, in other words the reticle plane or the object plane, wherein a homogeneously illuminated pupil illumination distribution 16 with a circular edge is obtained in an entrance pupil plane 15 of the EUV projection objective disposed downstream of the reticle 5, the pupil illumination distribution 16, also referred to as illumination setting, being shown in a schematic view in FIG. 7. The illumination setting 16 is a conventional illumination setting. Other illumination settings, such as an annular illumination setting, a dipole illumination setting or a quadrupole illumination setting, are conceivable as well, provided that the reflective surface 9 of the EUV collector 10 is designed accordingly.

The distance of the collector 10 from the specular reflector 14 amounts to 1800 mm.

The effect of the specular reflector 14 is described in US 2006/0132747 A1. Each individual channel, in other words each facet of the specular reflector 14, generates an image of the radiation source 2 on the reticle 5, the image being so small that an overexposure of the arcuate illumination field 4 is avoided. If a central circular element with a radius of 2.5 mm is blocked out in the bundle forming plane 11, a similarly circular and homogeneous illumination distribution of a comparable diameter is obtained in the object plane 3. If a corresponding extraaxial circular element with a radius of 2.5 mm is blocked out in the bundle forming plane 11, this results in a change of the illumination distribution in the object plane 3, wherein this change is such that the function of the specular reflector 14 is maintained.

The reflective surface 9 is formed such that the plurality of radiation source images generated thereby has an arrangement, namely the illumination distribution 12, which is adapted to the shape of the illumination field 4 to be illuminated. To this end, the surface 9 is divided into a plurality of reflective facets 17 which complement each other to form a total reflector surface of the reflective surface 9. The facets 17 cover the reflective surface 9 in the manner of a parquet or a tiling, with the result that the total reflector surface, in other words the entire, useful reflective surface, has virtually the same size as the reflective surface 9 itself.

Figure 4:
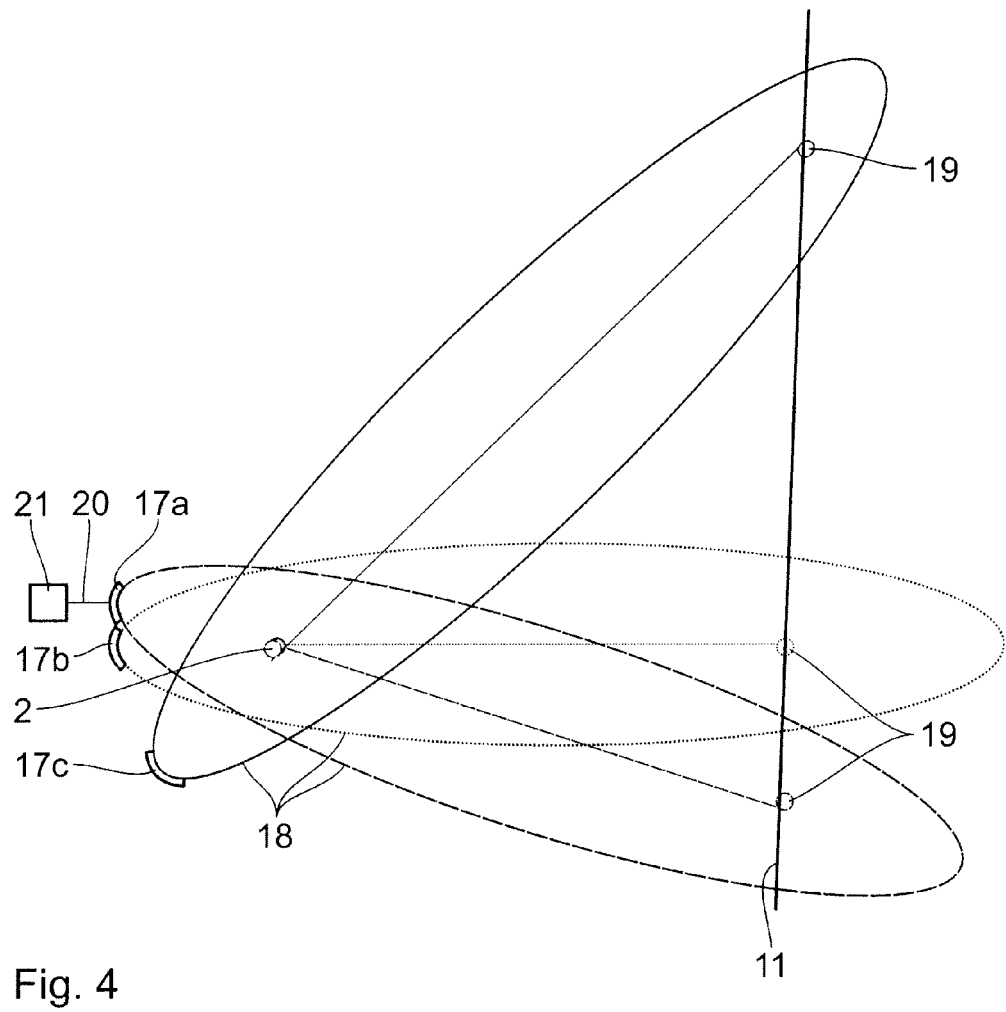
FIG. 4 shows a schematic view of the imaging effect of three selected facets of a bundle-guiding optical collector of the EUV illumination system according to FIG. 1 for collecting the emission of the EUV radiation source and for forming an EUV radiation bundle from the collected emission.

FIG. 4 shows an example of the imaging effect of three facets 17a, 17b, 17c selected from among the facets 17 of the reflective surface 9. The reflective surfaces of the individual facets 17a to 17c are sections of spheroids 18 which, for illustrative purposes, are shown in a sectional view in FIG. 4. The EUV radiation source 2 is disposed in one of the two focal points of these spheroids 18. One radiation source image 19 is in each case disposed in the second focal point of the spheroids 18. The radiation source images 19 are assigned to raster points in the bundle forming plane 11. The respective raster point, in other words the location of the radiation source image 19 in the bundle forming plane 11, can be selected by the tilting angle of the facets 17a to 17c. Owing to the raster arrangement, the radiation source images 19 are arranged offset to each other in two dimensions, namely in the x-direction and in the y-direction. The plurality of the radiation source images 19 defines a family of images. The edge contour of this family of images is at the same time an edge contour of the transformed radiation bundle 8 in the bundle forming plane 11. This bundle edge contour in the bundle forming plane 11 is non-rotationally symmetric relative to the beam direction 13 of the transformed radiation bundle 8.

The facets 17a to 17c can be actively tiltable. To this end, each facet 17a to 17c is individually connected, via a mechanical connection 20, to an actuator 21 which may for instance be a piezoelectric actuator.

When the facets 17a to 17c are tilted, the second focal point of the spheroids 18, in other words the location of the respective radiation source image 19, is tilted to a corresponding degree. Depending on the tilting angle, this results in that the radiation source images 19 may travel out of the bundle forming plane 11. This may result in a blurring of the radiation source images 19 on the specular reflector 14, which may even be desired, for instance for homogenization of the illumination of the illumination field 4.

The individual facets 17 may be arranged relative to each other in a discrete manner, in other words they may have reflective surfaces that are independent from each other. Alternatively, the individual facets 17 may also be designed as merging sections of a single reflective surface. The such designed reflective surface 9 may in turn be actively deformable via a mechanical connection between the location of every individual facet 17 and an actuator, thus enabling the reflective surface 9 to be deformed at the location of respective individual facets 17. Tilting angles of the active facets 17 may be adapted such that imaging errors caused by downstream components are compensated.

FIG. 5 illustrates the effect of the specular reflector 14. Likewise, the specular reflector 14 also includes a plurality of individual facets as described in US 2006/0132747 A1. Emanating from a subset of the facets of the specular reflector 14, an convergent individual radiation bundle 22 with an angle of aperture β of NA=0.25/4 and a main beam 23 generates a sufficiently small spot of light in the illumination field plane 3, thus illuminating the pupil illumination distribution 16 in the entrance pupil plane 15. All individual radiation bundles 22 emanating from the kidney-shaped illumination distribution 12 complement each other in the illumination field plane 3 to form the arcuate illumination field 4, with each of the individual radiation bundles 22 illuminating the entire pupil illumination distribution 16. The shape of the illumination distribution 12 is thus defined by a back projection of the shape of the illumination field 4 with the shape of the pupil illumination distribution 16.

Figure 8:
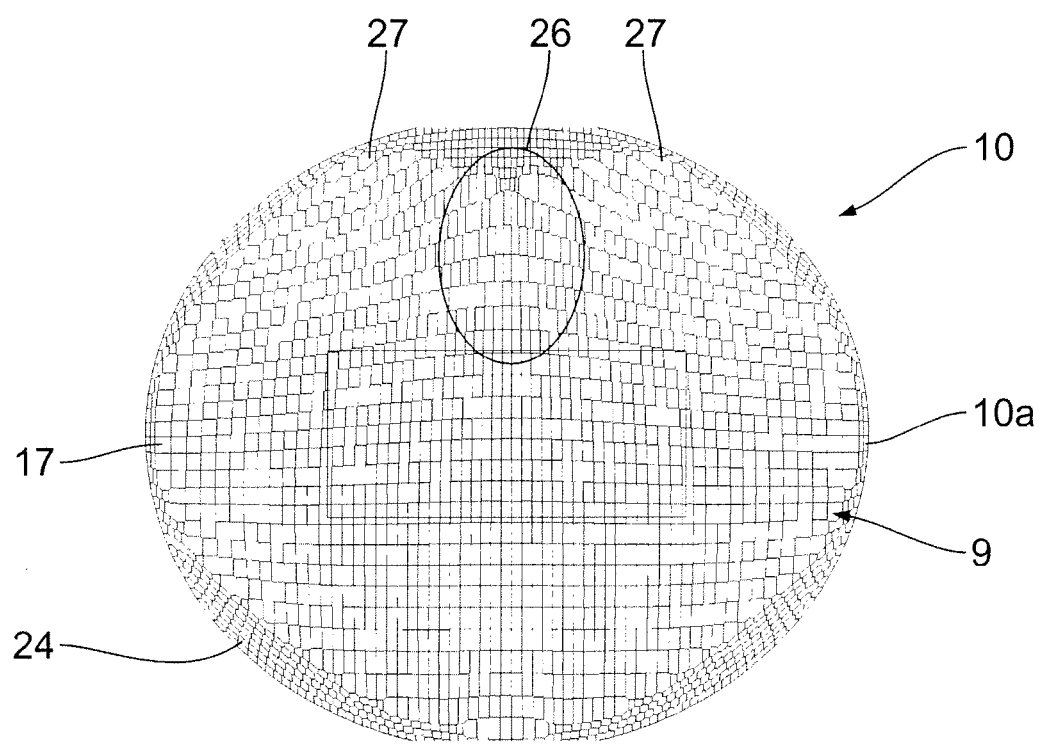
FIG. 8 shows a distribution of facets on the collector of the EUV illumination system.
Figure 9:
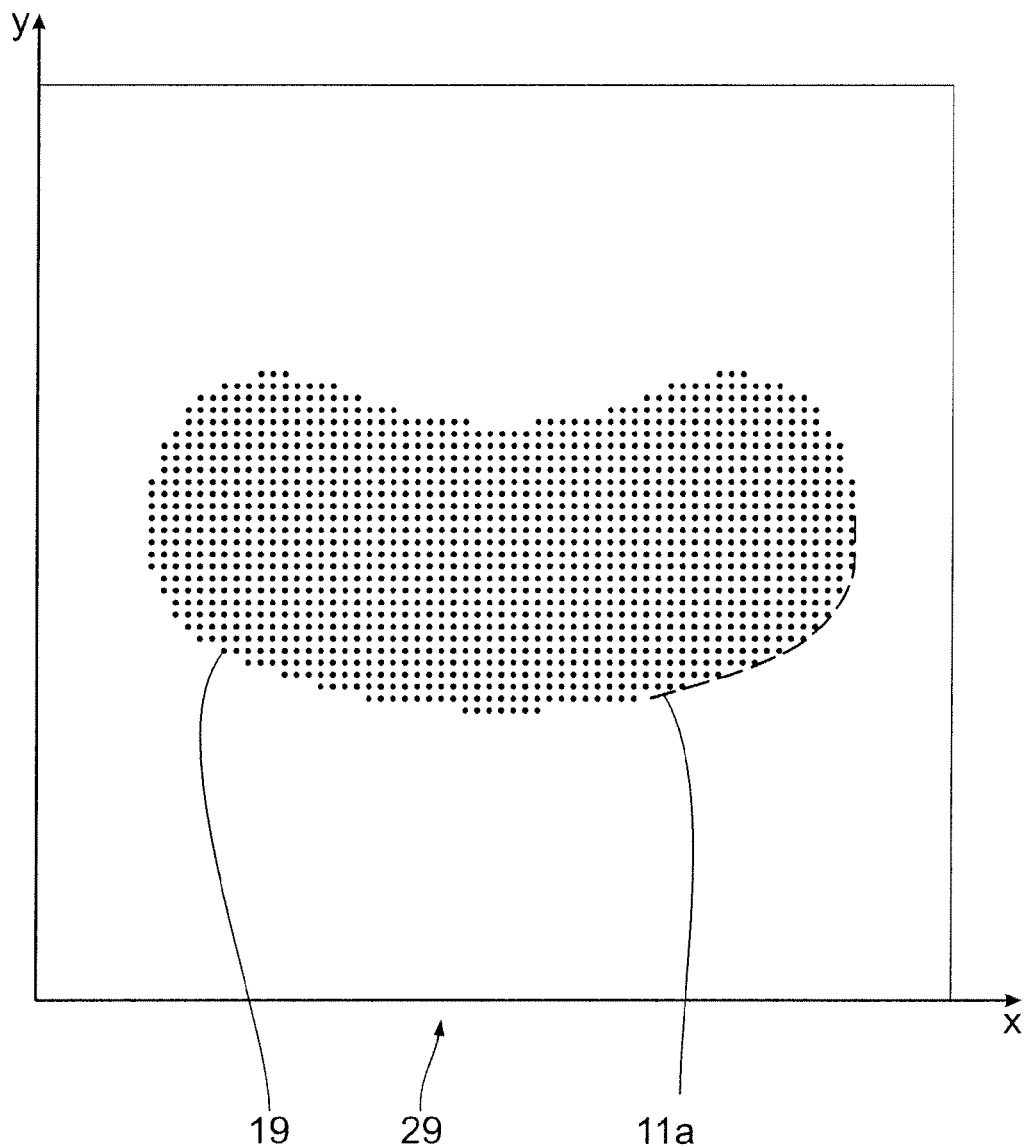
FIG. 9 shows an illumination distribution generated by the facet distribution of FIG. 8 in the plane of FIG. 2 prior to smoothing of the reflective surface of the collector.

FIG. 8 shows a possible coverage of the reflective surface 9 of the EUV collector 10 with the facets 17 for generation of the kidney-shaped illumination distribution 12 in the bundle forming plane 11. This coverage is arranged in a parquet or a tiling pattern on the reflective surface 9. This coverage was obtained by an algorithm which is described in Kochengin and Oliker, Inverse Problems 13 (1997), p. 363 to 367. Along with the active facets 17 for generating the illumination distribution 12, non-active facets 24 are shown at the edge of FIG. 8 which are smaller in area and do not generate any useful light within the kidney-shaped illumination distribution 12. The non-active facets 24 are a mathematical consequence, since the illumination distribution emanates from a rectangular facet raster. Coverages without such non-active facets 24 are conceivable as well, for instance by using a basic raster with a curved edge region. The absolute reflective surface area is the approximately same for all of the active facets 17 while edge regions thereof are shaped differently. In order to generate an indentation 25 in the kidney-shaped illumination distribution 12, the facets 17 are extended to a much greater degree in a section 26 of the reflective surface 9, shown in a central position at the top of FIG. 8, when seen in the vertical direction of FIG. 8 than in the horizontal direction of FIG. 8. This causes the reflective surface 9 to include less horizontal rows of active facets 17 in the central region than in lateral sections 27 at the level of protuberances 28 of the illumination distribution 12 which are adjacent to the indentation 25. The height of rows and the width of columns in which the active facets 17 are arranged thus varies along the course of the rows and columns from one side of the reflective surface 9 of the collector 10 to the other. FIG. 9 shows a discrete illumination distribution 29 at the location of the bundle forming plane 11, the illumination distribution 29 being the result of discrete active facets 17 which are disposed in the arrangement according to FIG. 8, wherein respective sections of the reflective facet surfaces are shaped in the manner of spheroids like the facets 17a to 17c according to FIG. 4. In this case, a discrete raster of radiation source images 19 is present, wherein the raster arrangement according to FIG. 9 corresponds to the row-and-column arrangement of the active facets 17 as shown in FIG. 8. The tilting angles of the active facets 17 relative to a main plane of the collector 10 are therefore comparatively small in terms of generation of the discrete illumination distribution 29. Comparatively large tilting angles, which are however still small when seen from an absolute point of view, are present in the region of those active facets 17 which illuminate the edge of the indentation 25, since this edge is illuminated by active facets 17 which are disposed near the edge of the EUV collector 10; in order to generate the indentation 25, however, these facets 17 need to deflect their assigned individual EUV radiation bundles towards the optical axis 13 to a relatively great extent.

Figure 10:
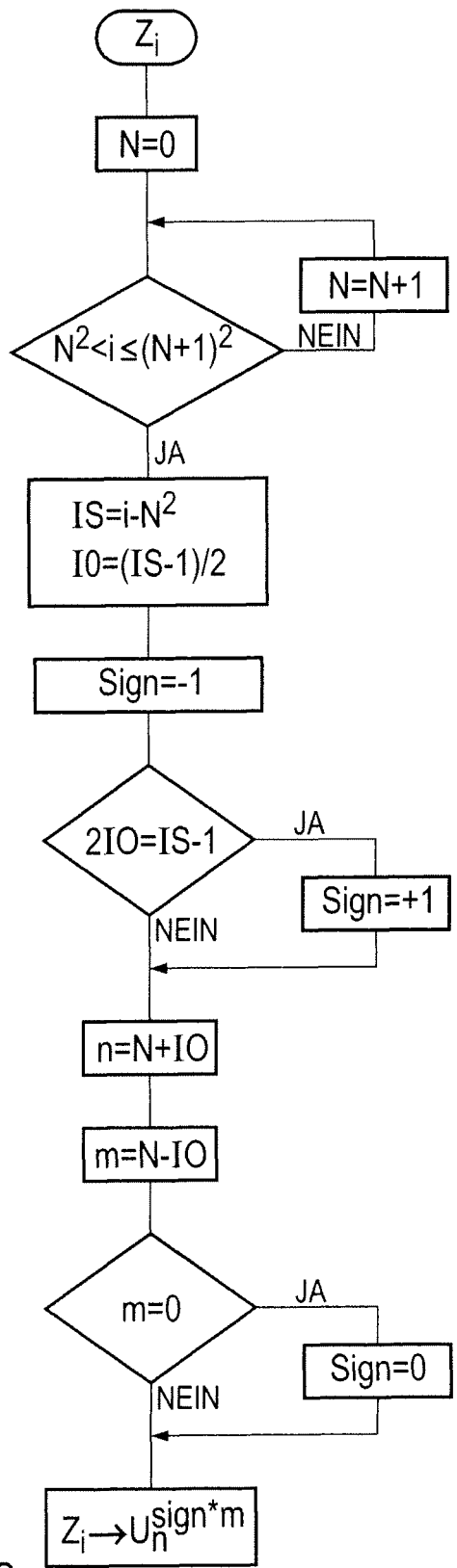
FIG. 10 shows a procedural sequence for the determination of Fringe-Zernike polynomials.
Figure 11:
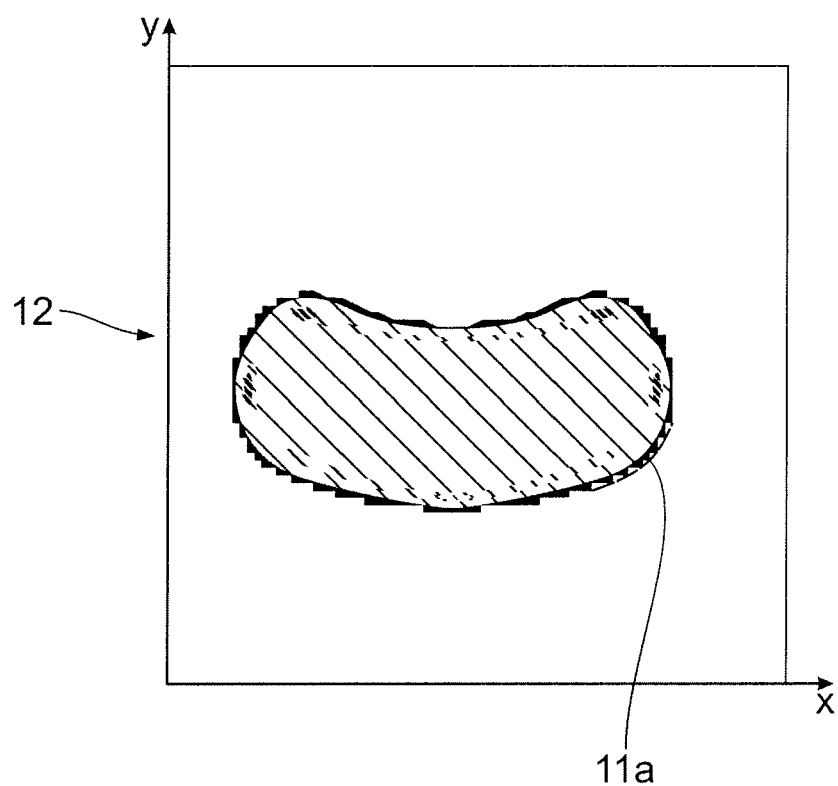
FIG. 11 shows the illumination distribution according to claim 9 after smoothing of the reflective surface.

The discrete illumination distribution 29 is converted into the continuous illumination distribution 12 by smoothing the edge regions of the individual facets 17, in other words by eliminating the discrete facet shapes. The smoothing operation results in that the reflective surface 9 is continuously differentiable at any position within the edges thereof and is therefore easier to produce. The continuous illumination distribution 12 is again shown in greater detail in FIG. 11. The denser the bold hatch pattern within the edge contour 11a, the higher the illumination intensity. The less dense hatching in the region next to the edge contour 11a shows the section of lowest intensity within the edge contour 11a. Smoothing is performed by scanning the reflective surface 9 of the EUV collector using an equidistant raster of 1024×1024 pixels and defining the surface shape according to Fringe-Zernike functions:

$$\Delta z(x, y) = \sum_{i=1}^{N} c_i \cdot Z_i\left(\frac{x}{h_0}, \frac{y}{h_0^5}\right)$$

z is the change in sag of the reflective surface 9 at the location x, y, with Zi being the i-th Fringe-Zernike polynomial. According to a calculation rule shown in FIG. 10, the Fringe-Zernike polynomials Zi are identifiable using the polynomials $U_n^m$ and $U_n^{-m}$ defined in Born and Wolf, Principles of optics, Pergamon Press (1991), chapter 9.2.1. ci is the expansion coefficient. $h_0$ is a standard radius. The standard radius will hereinafter also be referred to as norm height and is indicated in millimeters, just like z(x, y).

The following table shows the coefficients ci of the Fringe-Zernike polynomials for the first 81 terms which are used.

| Norm height = 321.626000000 | | |
|---|---|---|
| Factors of the Fringe-Zernike polynomials: | | |
| c1 = −0.36282323E+02 | c2 = 0.52718489E−03 | c3 = −0.60799468E−02 |
| c4 = −0.37405030E+02 | c5 = 0.24561432E+01 | c6 = −0.70658271E−04 |
| c7 = −0.59322581E−04 | c8 = 0.64653861E−01 | c9 = −0.30653572E+00 |
| c10 = −0.22168952E−04 | c11 = 0.24047111E+00 | c12 = 0.15096336E−01 |
| c13 = 0.55627835E−04 | c14 = 0.13773336E−04 | c15 = 0.28816122E−02 |
| c16 = 0.15954013E−01 | c17 = −0.38551372E+00 | c18 = 0.89462434E−05 |
| c19 = 0.15481795E−04 | c20 = −0.41014414E−01 | c21 = −0.86133808E−02 |
| c22 = −0.29464885E−04 | c23 = −0.12191269E−04 | c24 = −0.54210939E−02 |

-continued

Norm height = 321.626000000
Factors of the Fringe-Zernike polynomials:

| | | |
|---|---|---|
| $c_{25}$ = 0.14554570E−01 | $c_{26}$ = 0.21155484E−04 | $c_{27}$ = −0.10519986E+00 |
| $c_{28}$ = −0.55467558E−02 | $c_{29}$ = −0.21573681E−04 | $c_{30}$ = −0.41773659E−04 |
| $c_{31}$ = −0.14890301E−01 | $c_{32}$ = −0.49759139E−02 | $c_{33}$ = 0.19583693E−04 |
| $c_{34}$ = 0.12618462E−04 | $c_{35}$ = −0.62806532E−02 | $c_{36}$ = 0.91426547E−02 |
| $c_{37}$ = 0.38513612E−01 | $c_{38}$ = −0.69523336E−04 | $c_{39}$ = −0.31378782E−04 |
| $c_{40}$ = 0.31057266E−01 | $c_{41}$ = −0.13750521E−01 | $c_{42}$ = 0.41018648E−04 |
| $c_{43}$ = 0.38152655E−04 | $c_{44}$ = −0.63965189E−02 | $c_{45}$ = −0.10837851E−04 |
| $c_{46}$ = −0.86848020E−05 | $c_{47}$ = −0.60701056E−05 | $c_{48}$ = −0.38040827E−02 |
| $c_{49}$ = 0.44370980E−02 | $c_{50}$ = 0.26018572E−04 | $c_{51}$ = 0.46705923E−01 |
| $c_{52}$ = −0.16918508E−01 | $c_{53}$ = 0.48502320E−04 | $c_{54}$ = 0.41991300E−04 |
| $c_{55}$ = 0.88894335E−02 | $c_{56}$ = −0.10982292E−01 | $c_{57}$ = −0.40892313E−04 |
| $c_{58}$ = −0.17046214E−04 | $c_{59}$ = −0.64149589E−04 | $c_{60}$ = 0.12709571E−02 |
| $c_{61}$ = −0.17409344E−05 | $c_{62}$ = −0.13007798E−05 | $c_{63}$ = −0.32684958E−04 |
| $c_{64}$ = 0.17018354E−02 | $c_{65}$ = 0.13159945E−02 | $c_{66}$ = 0.27128648E−04 |
| $c_{67}$ = 0.17654505E−04 | $c_{68}$ = −0.10203257E−01 | $c_{69}$ = −0.24993567E−02 |
| $c_{70}$ = −0.42162504E−04 | $c_{71}$ = −0.34044751E−04 | $c_{72}$ = 0.14026511E−02 |
| $c_{73}$ = −0.64713310E−02 | $c_{74}$ = 0.23205449E−04 | $c_{75}$ = −0.49056809E−05 |
| $c_{76}$ = 0.22413459E−02 | $c_{77}$ = 0.10284166E−02 | $c_{78}$ = 0.64162272E−05 |
| $c_{79}$ = −0.42831912E−05 | $c_{80}$ = 0.23257738E−02 | $c_{81}$ = 0.16566163E−03 |

More than 88% of the entire circular total reflector surface of the EUV collector 10 are covered with smoothed active facets 17.

The ratio of the surface area, which is defined by the edge boundary of the illumination distribution 29, to the surface area of a circular illumination distribution which contains the illumination distribution 29, amounts to approximately 45%.

Figure 12:
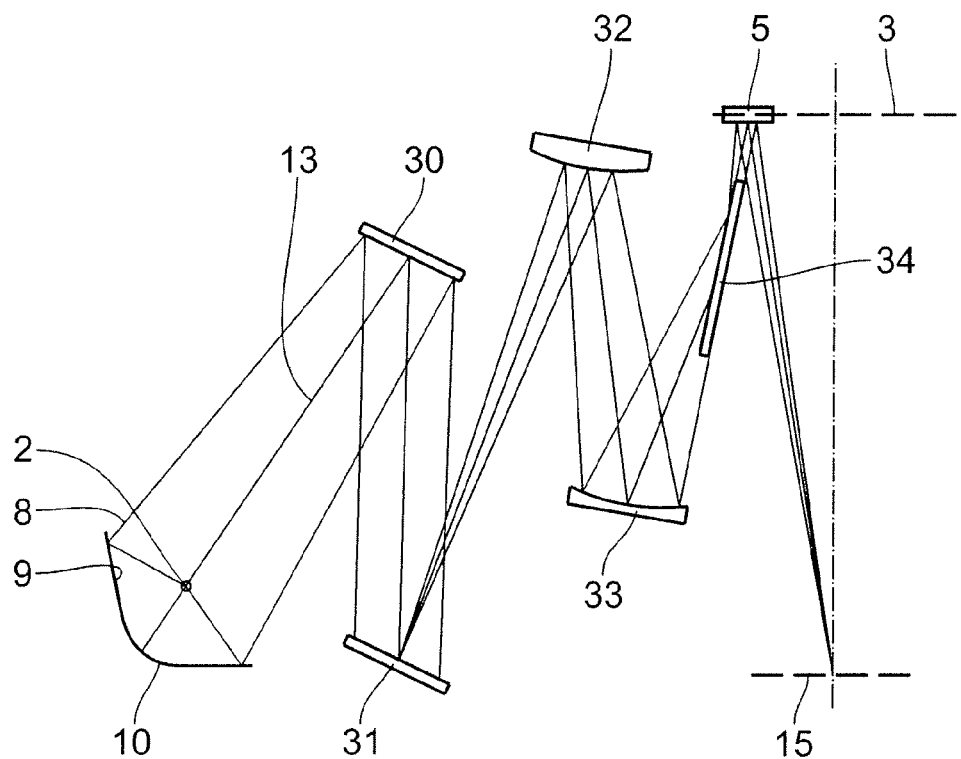
FIG. 12 shows another embodiment of an EUV illumination system for an EUV projection exposure apparatus.

FIG. 12 shows another embodiment of an EUV illumination system in an illustration similar to FIG. 3. Components which are equal to those described above with reference to FIGS. 1 to 11 are denoted by the same reference numerals and are not described in detail again.

Figure 13:
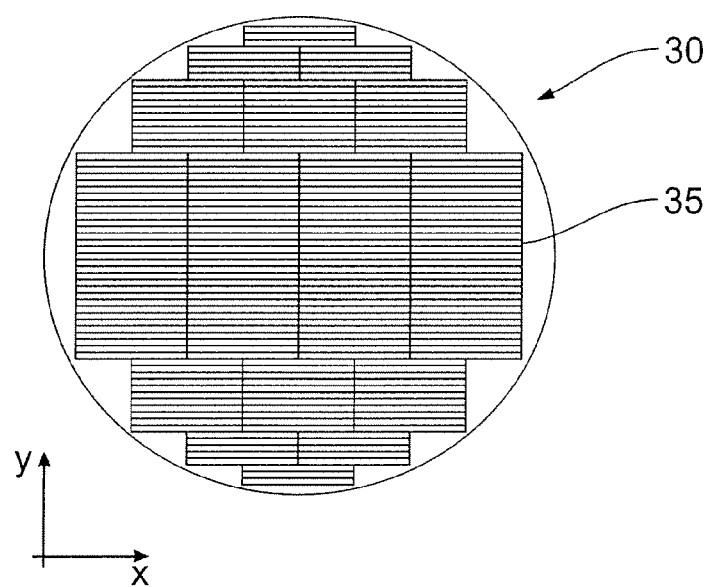
FIG. 13 shows a field facet mirror of the EUV illumination system according to FIG. 12.

Apart from the shaping of the reflective surface 9 of the EUV collector 10, the illumination system according to FIG. 12 corresponds to the illumination system according to FIG. 76 in U.S. Pat. No. 7,186,983 B2. The EUV radiation bundle 8 collected by the EUV collector 10 hits at first a field facet mirror 30. An example of a facet arrangement of the field facet mirror 30 is shown in FIG. 13 which corresponds to FIG. 73 of U.S. Pat. No. 7,186,983 B2. The field facets of the field facet mirror 30 are imaged into the illumination field 4 in the object plane 3 by a pupil facet mirror 31 and a downstream imaging optics which includes three EUV mirrors 32, 33, 34.

In the embodiment according to claim 12, the bundle forming plane 11 in which the radiation source images 19 are generated by the EUV collector 10 is located in a field plane. The EUV collector 10 according to FIG. 12 has a reflective surface 9 which is divided and formed into active facets 17 such that at the location of the field facet mirror 30, there is an illumination distribution 35 whose edge boundary coincides with the stepped outer contour of the actively reflective facet coverage of the field facet mirror 30.

Figure 14:
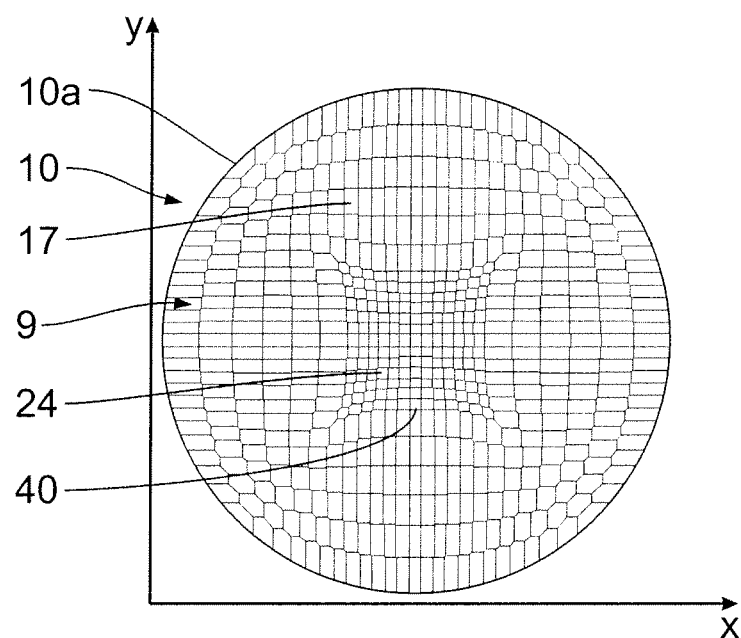
FIG. 14 shows a view similar to FIG. 8 of another embodiment of a facet distribution on an EUV collector which is applicable in an EUV illumination system which is similar to that of FIGS. 12 and 13.

FIG. 14 shows another embodiment of the facet coverage of an EUV collector 10. Components which correspond to those described above with reference to FIGS. 1 to 13 are denoted by the same reference numerals and are not described in detail again. Likewise, this example was calculated using an algorithm based on the scientific article Kochengin and Oliker, Inverse Problems 13 (1997), p. 363 to 367.

Figure 16:
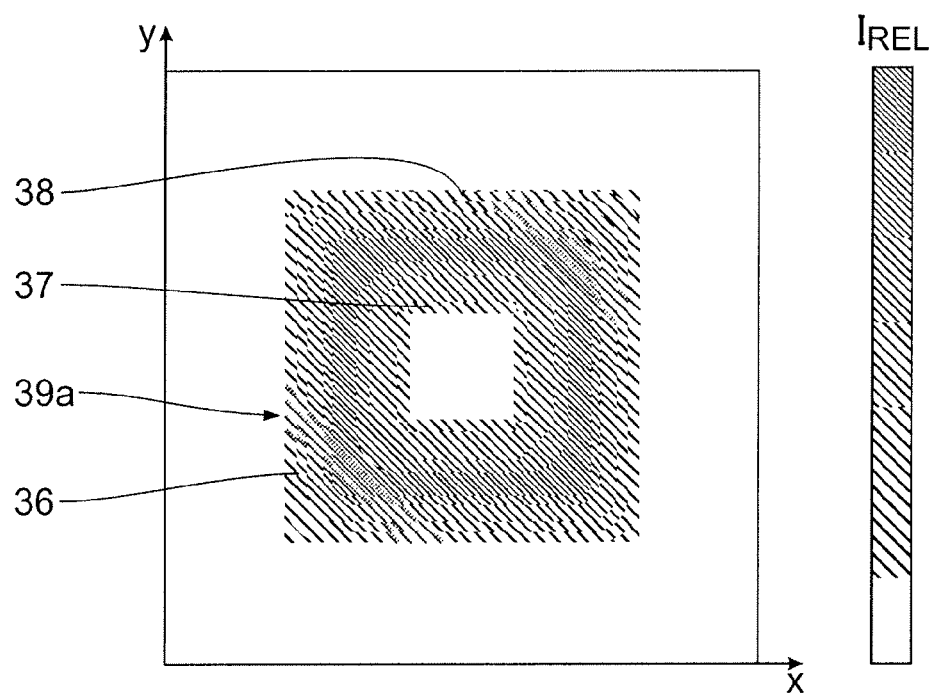
FIG. 16 shows the illumination distribution according to FIG. 15 after smoothing of the reflective surface of the collector.

Covering the reflective surface 9 of the collector 10 according to FIG. 14 with active facets 17 allows an illumination distribution 36 to be generated, whose smoothed-out, continuous shape is shown in FIG. 16. The illumination distribution 36 has the shape of a square frame which is delimited by an inner square envelope 37 and an outer square envelope 38. Inside the inner envelope 37 and outside the outer envelope 38, there is (if any) only a very low illumination intensity. Between the envelopes 37, 38, the illumination intensity increases at first continuously from the inner envelope 37 until approximately the center between the envelopes 37, 38 where the intensity continuously decreases again towards the outer envelope 38. An intensity scale on the right of FIG. 16 illustrates the assignment of the intensities to the different hatch patterns of FIG. 16. A square frame illumination of this type is desired for EUV illumination systems in which central regions of the field facet mirror 30 cannot be transmitted to the illumination field in the object plane 3.

Figure 15:
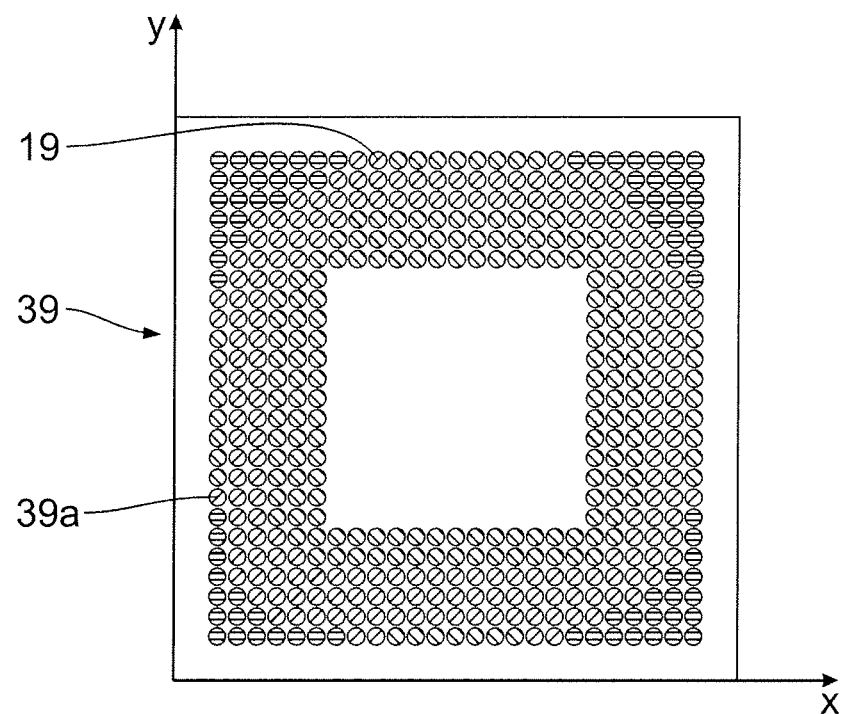
FIG. 15 shows an illumination distribution prior to a smoothing of the reflective surface of the collector, the illumination distribution being generated by the collector of FIG. 14 in a plane in which is arranged a field raster element of the EUV illumination system similar to FIG. 12.

Corresponding to FIG. 9, FIG. 15 shows a discrete illumination distribution 39 before smoothing of the reflective surface 9 of the collector 10 according to FIG. 14, in other words as long as discrete reflective areas of the active facets 17 are still present in the shape of spheroids. The illumination distribution 39 has a square edge contour 39a which is, in other words, again mirror-symmetric relative to two perpendicular axes spanning the edge contour 39a. These two axes may for instance be the two diagonals of the square edge contour 39a or the two perpendicular bisectors of the bundle edge contour 39a.

In a pillow-shaped central portion 40 of the reflective surface 9 of the collector 10 according to FIG. 14, there are non-active facets 24 which again have a much smaller surface area than the active facets 17. A likewise square inner region of the illumination distribution 39 is impinged by the non-active facets 24, with the result that the illumination intensity in this region is negligible compared to the intensity in other regions. In the corners of the square edge contour, there is an illumination intensity which is slightly higher than the illumination intensity in other regions. An intensity next to the inner square region of the edge contour 39 is slightly lower than the illumination intensity in other regions. This is indicated in FIG. 15 by corresponding hatch patterns.

Each active facet 17 is assigned a radiation source image 19, wherein the raster position of the radiation source image 19, in other words the row and column in which it is disposed, corresponds in each case to the position of the active facet 17.

The light losses due to the non-active facets 24 amount to approximately 5% in the embodiment according to FIG. 14. The total surface area of all non-active facets 24 taken together thus amounts to approximately 1/20 of the surface area of the active facets 17 in the embodiment according to FIG. 14.

Likewise, other embodiments of the shape of the reflective surface 9 are conceivable by which it is possible to generate a shape in the bundle forming plane 11 which is adapted to the rest of the EUV illumination system 1 and deviates from the rotational symmetry. All these reflective surfaces of the various embodiments of the EUV collector 10 have in common that there is at least one section through the reflective surface 9 which includes an incident ray and a reflected ray of one and the same EUV emission ray (cf. rays 8a and 8 in FIG. 1) which is not parameterizable by a conic section.

The EUV collector 10 generally has a freeform surface as reflective surface 9. The sag of such a freeform surface is parameterizable, as it is known to those skilled in the art with respect to the parameterization of the reflective freeform surfaces of mirrors in an EUV projection objective. Likewise, spline functions such as NURBS (Non Uniform Rational Bezier Splines) are applicable for parameterization of such freeform surfaces as well.

Segments of the reflective surface 9 can also be actively deformable or tiltable. The shape of these segments need not correspond to that of the facets. Thus, a deformable or tiltable segment may for instance include a plurality of facets.

The design of the reflective surface 9 of the EUV collector is performed as follows: In a first step, the illumination distribution 12 is defined numerically or analytically in the bundle forming plane 11. The bundle forming plane 11 in which the illumination distribution 12 is defined need not necessarily be a straight plane but can also be a curved plane. Furthermore, the radiation pattern of the radiation source 2 and the space region to be collected, i.e. for instance the angle of aperture α, are defined as well. It is conceivable to collect a solid angle region Ω having an edge boundary with any desired shape which need not have any symmetry whatsoever and may also include obscurations. The emission 8a of the radiation source 2 need not necessarily be collected directly. The image of the radiation source 2 can be collected as well, in other words a secondary radiation source can be collected. Afterwards, a distance to be maintained between the collector 10 and the radiation source 2 is defined, and the collector 10 is inserted in the illumination system, strictly speaking in the beam path between the radiation source 2 and the bundle forming plane 11, wherein the numerical parameterization of the surface of the collector 10 is not complete yet at this point. The reflective surface 9 is now parameterized by a set of functions which is suitable for describing freeform surfaces. Afterwards, a quality function is generated which is substantially based on the aberrations of an actual illumination profile generated by the inserted reflective surface 9 from a desired illumination profile, in other words the illumination distribution 12. The coefficients of the parameterization of the reflective surface are now varied by conventional methods of local or global optimization in order to maximize the quality function. In this process, process-related marginal conditions such as maximum and minimum angles of incidence or the installation size are taken into account as well. A reflectivity of the mirror layer, which varies locally on the collector 10, can be given within the limits of a desired illumination profile in an iterative manner so as to achieve a compensation of the varying collector reflectivity by correspondingly varying the illumination of the collector 10 via the source-side radiation bundle 8a.

FIG. 1 shows a convergent illumination of the specular reflector at the location of the bundle forming plane 11. The individual facets 17 generate images of the radiation source images 19 in the same direction when seen from the edge of the collector 10, for example. Partial bundles of the radiation bundle 8 which are observed at the edge of the collector 10 in a rotational direction about the optical axis 13 generate the radiation source images 19 in the same rotational direction.

Figure 17:
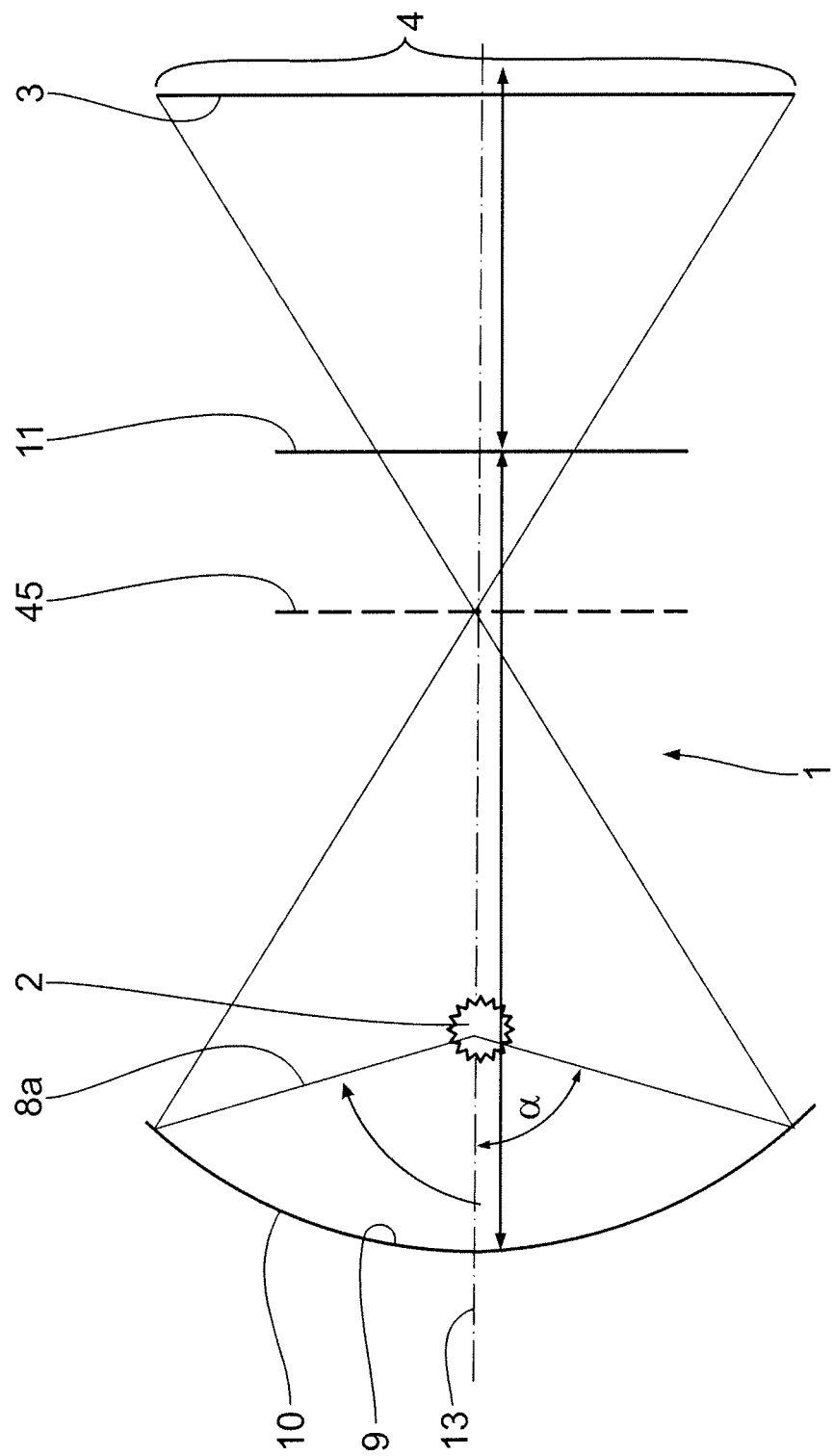
FIG. 17 shows a view similar to FIG. 1 of an alternative illumination of a bundle forming plane in an EUV illumination system of an EUV projection exposure apparatus including another version of a collector.

FIG. 17 shows—in an illustration similar to FIG. 1—a divergent illumination of the specular reflector in the bundle forming plane 11, with a caustic plane 45 being located between the collector 10 and the bundle forming plane 11. In contrast to the convergent illumination according to FIG. 1 in which the radiation source images 19 are generated in the same direction, the divergent illumination according to FIG. 17 generates radiation source images 19 in the opposite direction. Partial bundles of the radiation bundle 8 which are observed at the edge of the collector in a rotational direction about the optical axis 13 generate the radiation source images 19 in the opposite rotational direction. A collector edge contour 10a, 11a of the collector 10 as well as a bundle edge contour of the EUV radiation bundle in the bundle forming plane 11 correspond to the edge contours described above in relation to FIGS. 1 to 3.

What is claimed is:

1. An optical system having an illumination field, the optical system comprising:
    a bundle-guiding optical collector configured to collect radiation emitted by a radiation source and to form a transformed radiation bundle from a collected source-side radiation bundle, the bundle-guiding optical collector comprising a reflective surface which is a first bundle-forming surface downstream of the radiation source; and
    a bundle-guiding optical element upstream of the illumination field along a path of the radiation through the optical system,
    wherein:
        the reflective surface comprises a plurality of reflective facets that complement each other to provide a total reflector surface;
        at least some of the facets have aspheric reflector surfaces;
        the reflective surface is configured to convert the radiation into a family of images in a downstream plane;
        the family of images includes a plurality of radiation source images offset from each other in two dimensions relative to a beam direction of the transformed radiation bundle;
        the family of images is arranged relative to each other in a non-rotationally symmetric manner with respect to the beam direction of the transformed radiation bundle so that the transformed radiation bundle in the downstream plane has a non-rotationally symmetric bundle edge contour relative to the beam direction of the transformed radiation bundle; and
        the bundle-guiding optical element is in the downstream plane.

2. The optical system according to claim 1, wherein the reflective surface is configured so that the bundle edge contour is adapted to a shape of a field to be illuminated.

3. The optical system according to claim 1, wherein the reflective surface is configured so that the bundle edge contour is adapted to a shape of the bundle-guiding optical element.

4. The optical system according to claim 3, wherein the bundle-guiding optical element comprises a field facet mirror.

5. The optical system according to claim 1, wherein the facets form a parquet.

6. The optical system according to claim 1, wherein at least two of the facets are different surface areas.

7. The optical system according to claim 1, wherein the facets comprise facets having differently shaped edge contours.

8. The optical system according to claim 1, wherein the facets are in rows and/or columns, and a height of the rows and/or a width of the columns varies along a course from a first side of the reflective surface to a second side of the reflective surface.

9. The optical system according to claim 1, wherein at least some of the facets have ellipsoidal reflector surfaces.

10. The optical system according to claim 1, wherein the reflective surface between the facets is smoothed out so that the reflective surface is continuously differentiable at any point within a boundary of the reflective surface.

11. The optical system according to claim 1, wherein the reflective surface between the facets is smoothed so that a continuous illumination distribution is obtained within the bundle edge contour.

12. The optical system according to claim 1, wherein the reflective surface is a freeform surface.

13. The optical system according to claim 1, wherein segments of the reflective surface and/or the facets are actively deformable or tiltable.

14. The optical system according to claim 1, wherein a tilting angle of the facets is configured so that imaging errors caused by downstream components are compensated.

15. The optical system according to claim 1, wherein the non-rotationally symmetric bundle edge contour has at least a two-fold symmetry.

16. An optical system having an illumination field, the optical system comprising:
a bundle-guiding optical collector configured to collect radiation emitted by a radiation source and to form a transformed radiation bundle from a collected source-side radiation bundle, the bundle-guiding optical collector comprising a reflective surface which is a first bundle-forming surface downstream of the radiation source; and
a bundle-guiding optical element upstream of the illumination field along a path of the radiation through the optical system,
wherein:
a collector edge contour of the reflective surface has a shape that is mirror-symmetric in relation to two perpendicular axes spanning the collector edge contour;
the reflective surface of the collector is configured so that a bundle edge contour of the transformed radiation bundle in a downstream plane has a shape that is mirror-symmetric in relation to a maximum of one axis that is perpendicular to a main beam direction of the transformed radiation bundle in a vicinity of the plane;
the reflective surface of the collector is configured to convert the radiation into a family of images in the downstream plane;
the family of images includes a plurality of radiation source images; and
the bundle-guiding optical element is in the downstream plane.

17. A system having an illumination field, the system comprising:
a radiation source capable of emitting radiation;
a collector; and
a bundle-guiding optical element,
wherein:
the collector is a bundle-guiding optical collector configured to collect the radiation emitted by the radiation source and to form a transformed radiation bundle from a collected source-side radiation bundle;
the bundle-guiding optical collector comprises a reflective surface which is a first bundle-forming surface down-stream of the radiation source;
the reflective surface is configured to convert the radiation into a family of images in a downstream plane which is upstream of the illumination field of the system;
the family of images includes a plurality of radiation source images offset from each other in two dimensions relative to a beam direction of the trans-formed radiation bundle;
the family of images is arranged relative to each other in a non-rotationally symmetric manner with respect to the beam direction of the transformed radiation bundle so that the transformed radiation bundle in the downstream plane has a non-rotationally symmetric bundle edge contour relative to the beam direction of the transformed radiation bundle;
the bundle-guiding optical element is in the downstream plane; and
the system is an EUV illumination system.

18. The system according to claim 17, wherein the non-rotationally symmetric bundle edge contour has at least a two-fold symmetry.

19. An apparatus, comprising:
an EUV illumination system, comprising:
a radiation source capable of emitting radiation;
a collector;
a bundle-guiding optical element; and
a projection objective configured to image an object field illuminated by the EUV illumination system into an image field in an image plane,
wherein:
the collector is a bundle-guiding optical collector configured to collect the radiation emitted by the radiation source and to form a trans-formed radiation bundle from a collected source-side radiation bundle;
the bundle-guiding optical collector comprises a reflective surface which is a first bundle-forming surface down-stream of the radiation source;
the reflective surface is configured to convert the radiation into a family of images in a downstream plane which is upstream of the object plane of the projection objective;
the family of images includes a plurality of radiation source images offset from each other in two dimensions relative to a beam direction of the trans-formed radiation bundle;
the family of images is arranged relative to each other in a non-rotationally symmetric manner with respect to the beam direction of the transformed radiation bundle so that the transformed radiation bundle in the downstream plane has a non-rotationally symmetric bundle edge contour relative to the beam direction of the transformed radiation bundle;
the bundle-guiding optical element is in the downstream plane; and
the apparatus is an EUV projection exposure apparatus.

20. The apparatus according to claim 19, wherein the downstream plane does not coincide with a plane selected from the group consisting of a field plane of the projection objective, a pupil plane of the projection objective, a plane conjugated with the field plane of the projection objective, and a plane conjugated with the pupil plane of the projection objective.

21. The apparatus according to claim 19, wherein the downstream plane coincides with a plane selected from the group consisting of a field plane of the projection objective, a pupil plane of the projection objective, a plane conjugated with the field plane of the projection objective, and a plane conjugated with the pupil plane of the projection objective.

22. The apparatus according to claim 19, wherein the non-rotationally symmetric bundle edge contour has at least a two-fold symmetry.

* * * * *

UNITED STATES PATENT AND TRADEMARK OFFICE
CERTIFICATE OF CORRECTION

| | | |
|---|---|---|
| PATENT NO. | : 8,934,085 B2 | Page 1 of 1 |
| APPLICATION NO. | : 12/726081 | |
| DATED | : January 13, 2015 | |
| INVENTOR(S) | : Dinger et al. | |

It is certified that error appears in the above-identified patent and that said Letters Patent is hereby corrected as shown below:

In the Specification

Col. 1, line 12, delete "Sep. 17, 2007." and insert -- Sep. 21, 2007. --

Signed and Sealed this
Nineteenth Day of May, 2015

Michelle K. Lee
*Director of the United States Patent and Trademark Office*